(12) United States Patent
Camuffo

(10) Patent No.: US 7,724,094 B2
(45) Date of Patent: May 25, 2010

(54) DIGITAL PHASE LOCKED LOOP AND METHOD FOR CORRECTING INTERFERENCE COMPONENTS IN A PHASE LOCKED LOOP

(75) Inventor: Andrea Camuffo, München (DE)

(73) Assignee: Infineon Technologies AG, Munich (DE)

( * ) Notice: Subject to any disclaimer, the term of this patent is extended or adjusted under 35 U.S.C. 154(b) by 430 days.

(21) Appl. No.: 11/440,656

(22) Filed: May 24, 2006

(65) Prior Publication Data

US 2006/0279365 A1   Dec. 14, 2006

(30) Foreign Application Priority Data

May 24, 2005   (DE) .................. 10 2005 023 909

(51) Int. Cl.
*H03L 7/08* (2006.01)

(52) U.S. Cl. .................. 331/17; 331/16; 327/156; 375/376

(58) Field of Classification Search .............. 331/16, 331/17; 327/156; 375/376
See application file for complete search history.

(56) References Cited

U.S. PATENT DOCUMENTS

| | | | | |
|---|---|---|---|---|
| 4,321,555 A | * | 3/1982 | Howk et al. ............... | 331/1 A |
| 4,904,917 A | * | 2/1990 | Hakluytt .................... | 318/696 |
| 5,018,170 A | | 5/1991 | Wilson | |
| 5,036,294 A | * | 7/1991 | McCaslin .................. | 331/1 A |
| 5,079,521 A | * | 1/1992 | Gaskell et al. ............. | 331/1 A |
| 5,334,952 A | * | 8/1994 | Maddy et al. ............. | 331/1 A |
| 5,442,315 A | * | 8/1995 | Hutchins .................... | 327/159 |
| 5,821,816 A | | 10/1998 | Patterson | |
| 6,028,488 A | * | 2/2000 | Landman et al. .......... | 331/1 A |
| 6,107,890 A | * | 8/2000 | Carson et al. ............. | 331/17 |
| 6,593,783 B2 | | 7/2003 | Ichimaru | |
| 6,658,748 B1 | | 12/2003 | Leipold et al. | |
| 6,670,854 B2 | * | 12/2003 | Takeda et al. ............. | 331/1 A |

FOREIGN PATENT DOCUMENTS

| | | |
|---|---|---|
| DE | 103 09 335 A1 | 7/2004 |
| JP | 5218855 A | 8/1993 |
| JP | 1993-218855 | 3/1995 |
| JP | 1999-234129 | 3/2001 |
| JP | 2001-177407 | 6/2001 |
| JP | 2001-77871 | 9/2002 |
| JP | 2002-76886 | 12/2002 |
| JP | 2002-33660 | 8/2003 |

OTHER PUBLICATIONS

Office Action dated August 19, 2008 in corresponding Japanese Patent Application No. 2006-144572.

* cited by examiner

*Primary Examiner*—Robert Pascal
*Assistant Examiner*—Levi Gannon
(74) *Attorney, Agent, or Firm*—Eschweiler & Associates, LLC

(57) ABSTRACT

A correction circuit in a digital phase locked loop is disclosed having a first terminal, a second terminal, a value-discretely tunable oscillator, an integrator, a loop filter, and a feedback path. A correction circuit is connected to an input of the integrator on the input side and to an output of the integrator on the output side. The correction circuit generates a correction word derived from an actuating word fed to the input of the integrator and a word derived from the second frequency word. A periodic error component in the frequency setting word output by the integrator can thus be corrected by the correction circuit.

25 Claims, 6 Drawing Sheets

DIGITAL PHASE LOCKED LOOP AND METHOD FOR CORRECTING INTERFERENCE COMPONENTS IN A PHASE LOCKED LOOP

REFERENCE TO RELATED APPLICATIONS

This application claims the benefit of the priority date of German application DE 10 2005 023 909.9, filed on May 24, 2005, the contents of which are herein incorporated by reference in their entirety.

FIELD OF INVENTION

The invention relates to a digital phase locked loop, and furthermore relates to a method for correcting interference components in an output signal of a digital phase locked loop.

BACKGROUND OF INVENTION

In telecommunications and mobile radio technology, a requirement exists that the circuits necessary for data transmission are to be realized as integrated circuits in semiconductor bodies. In this case, the development of radiofrequency assemblies is striving for an ever higher integration density and easier portability to more finely patterned semiconductor processes. The desire for easy portability is often impeded by the technology used heretofore, which is essentially based on analog signal processing. For this reason, circuits are increasingly being designed and implemented for radiofrequency assemblies which comprise fully digital signal processing. These circuits additionally have the advantage that they can already be integrated into existing digital elements.

One group of devices that enables fully digital signal processing is the digital phase locked loop (all-digital PLL). The latter is often suitable for use in reception paths of mobile communication devices in which the generation of a pure carrier signal is required.

The inventor is aware that some digital phase locked loops generate interference signals. This is effected primarily if the desired output frequency of the digital phase locked loop is close to an integer multiple of a reference frequency used.

FIG. 6a shows a frequency-power diagram of a digital phase locked loop. It shows the phase noise of the output signal generated by the digital phase locked loop as a function of frequency spacing. It can clearly be discerned that additional interference signals are generated at a spacing of 60 kHz, 120 kHz and 180 kHz from the carrier signal. Thus, by way of example, the interference signal SP1, at a spacing of 60 kHz from the carrier signal, reaches a magnitude of −20 dBc, relative to the resolution bandwidth RBW of the measurement. The further interference signals SP2 and SP3, too, which represent the harmonic components of the interference signal SP1 at 120 kHz and 180 kHz, are possibly not suppressed sufficiently with respect to the carrier signal. These interference signals mean that the transmission quality is impaired and require complex filter measures to suppress them.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The invention is directed to a digital phase locked loop in which the interference components in the output signal are reduced. The invention is also directed to a method for correcting a phase locked loop by means of which the interference signals can be reduced.

In accordance with one embodiment of the invention, a digital phase locked loop comprises a first terminal for feeding in a first frequency word and also a second terminal for feeding in a second frequency word. In the phase locked loop, a value-discretely tunable oscillator is provided in the forward path. Connected upstream of an actuating input of the value-discretely tunable oscillator is a loop filter and also an integrator. A feedback path of the phase locked loop comprises a counting device, which is configured to output a word derived from the signal of the value discretely tunable oscillator and a reference signal. An output of the counting device is coupled to the first terminal of the control loop. According to one embodiment, a correction circuit is furthermore provided, which is connected to an input of the integrator on the input side and to an output of the integrator on the output side. The correction circuit is configured to for generate a correction word derived from an actuating word fed to the input of the integrator and a word derived from the second frequency word.

An error component caused by the integrator in the control loop is corrected by means of the correction circuit in the phase locked loop. The error component is generated by the temporal behavior of the actuating word, which becomes apparent primarily in the case of specific settings of the first and second frequency words fed to the phase locked loop. In one embodiment of the invention, the correction circuit comprises a summation unit, to which the word derived from the second frequency word can be fed at a first input. The second input of the summation unit is coupled to the output of the summation unit to form a feedback path. The output of the summation unit at the same time also forms the output of the correction circuit.

By means of this exemplary configuration, a correction signal is generated in a manner dependent on the word derived from the second frequency word, the value of the correction signal increasing with each step by the value of the derived word. In a suitable embodiment, the summation unit contains an overflow output that can be used to indicate an overflow, that is to say an amount that exceeds a maximum value. As a result, a periodic correction signal can be generated in a simple manner, the periodicity corresponding to a periodicity of the error component of the integrated word downstream of the integrator.

In a further embodiment of the invention, the correction circuit comprises a control circuit, which, with a first input, forms the input of the correction circuit. A start signal is fed to the control circuit at a second input. In one example, the start signal is formed by the overflow signal of the summation unit. The control circuit is configured to enable the generation of the correction word given the presence of a specific word at the first input and of the start signal.

With the aid of the control circuit, a possibility is afforded of synchronizing the generation of the correction word with the generation of the error component within the control loop. In other words, the control circuit synchronizes a phase of the error component in the output word of the integrator with a phase of the correction word. In one embodiment, the control circuit is configured to temporally regulate the outputting of the correction word. An optimum suppression of the error component is thereby achieved.

In one embodiment of the invention, the word derived from the second frequency word comprises the second frequency word. In this embodiment, it is expedient for the correction word generated by the correction circuit to be subtracted from the word output by the integrator in the phase locked loop.

In another embodiment, the word derived from the second frequency word forms the difference between a maximum value of the second frequency word and a value of the second frequency word. If the second frequency word can thus assume values of between zero and a maximum value, in this embodiment the word derived from the second frequency word is the difference between the maximum value minus the value of the second frequency word. In this embodiment, the output of the correction circuit is additively coupled to the forward path of the phase locked loop.

In one embodiment of the invention, the forward path of the phase locked loop also comprises an adder besides an integrator. The adder is connected upstream of the input of the integrator and has a first input and a second input. The first input is coupled to the first terminal of the correction circuit and the second input is coupled to the second terminal of the correction circuit. In this example, a frequency setting word composed of the first frequency word and the second frequency word is thus advantageously fed to the integrator. This is expedient particularly when the first frequency word represents an integer component and the second frequency word represents a fractional component. The corresponding frequency setting word represents the sum of both. It thus becomes possible for the phase locked loop to generate output signals having a frequency which correspond to a non-integer multiple of a reference frequency.

In a further embodiment, a modulator, for example a $\Sigma$-$\Delta$ modulator, is connected between the output of the correction circuit and the connection to the forward path of the phase locked loop. A $\Sigma$-$\Delta$ modulator is likewise connected downstream of the second terminal of the phase locked loop for feeding in the second frequency word. In one embodiment, at least one of these modulators is embodied as a cascaded sigma-delta modulator.

In another embodiment, the counting device in the feedback path of the control loop is configured to determine the number of clock periods of the signal output by the value-discretely tunable oscillator with respect to a clock period of the reference signal. Accordingly, the counting device counts the number of clock periods of the signal output by the value-discretely tunable oscillator and outputs the result to its output in each case after a clock period of the reference signal. In one example, the counting device determines the rising or falling clock edges of the signal output by the oscillator with respect to a rising or falling clock edge, respectively, of the reference signal.

A difference element is furthermore provided, which is connected by one input to the first terminal of the phase locked loop and by a second input to the output of the counting device. The element is configured to output a difference between words present on the input side at an output. The output is connected to the input of the correction circuit. Consequently, the word output by the counting device is subtracted from the first frequency word and the result is output both to the correction circuit and to the integrator in the forward path of the phase locked loop. The result of this subtraction at the same time also forms the word fed to the correction circuit for the generation of the correction word.

For the correction of interface in a digital control loop, accordingly, a phase locked loop is provided and a first frequency word and a second frequency word are fed to the phase locked loop. A frequency setting word is generated therefrom. Depending on the frequency setting word, the phase locked loop, in particular an oscillator of the phase locked loop, forms an output signal having a clock period. The number of clock periods of the output signal is determined with respect to a clock period of a reference signal. This operation is necessary in order to correct a frequency drift in the output signal of the phase locked loop. A correction word is subsequently generated, the clock period of which is derived from the second frequency setting word. A phase of the correction word is derived from the first frequency word and the number of clock periods of the output signal. The correction word is fed to the phase locked loop and expediently to the frequency setting word.

The correction word is used to correct an erroneous component in the frequency setting word that is generated by the signal processing within the phase locked loop, in particular by the differences in the number of clock periods of the output signal and the first frequency word. In one embodiment of the method, the step of generating a frequency setting word includes the forming a difference word from the first frequency word and the determined number of clock periods, and adding the second frequency word to the difference word. A frequency setting word is generated by integrating the sum of the second frequency word and the difference word, and the frequency setting word is, filtered and fed to a control input of a value-discretely tunable oscillator.

The operations of forming a difference word and the subsequent integration of the sum of the difference and the second frequency word essentially correspond to determining a phase offset and generating a corresponding actuating signal for the value-discretely tunable oscillator. In one example, the correction word is either added to the frequency setting word prior to a filtering or subtracted from the frequency setting word. This is dependent on the generation of the correction word. In one embodiment, the correction word is generated by adding the second frequency word to the result of a preceding operation. The respective result forms the correction word. In a further step, the frequency word is in turn added to the result of the preceding operation. This gives rise to a correction word rising temporally in value-discrete steps by, in each case, the value of the second frequency word up to a maximum value. The procedure begins again when the maximum value is exceeded. The correction word thus produced is accordingly periodic, the clock period being dependent on the magnitude of the second frequency word and the maximum value.

As an alternative, the correction word is generated by adding the difference between the maximum value and the second correction word to the result of the preceding operation. This leads to a correction word that is temporally mirrored with respect to the error component in the frequency setting word of the control loop. This temporally mirrored correction word is additively fed to the frequency setting word.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below on the basis of a plurality of exemplary embodiments with reference to the drawings, in which.

DETAILED DESCRIPTION OF THE INVENTION

Figure 1:
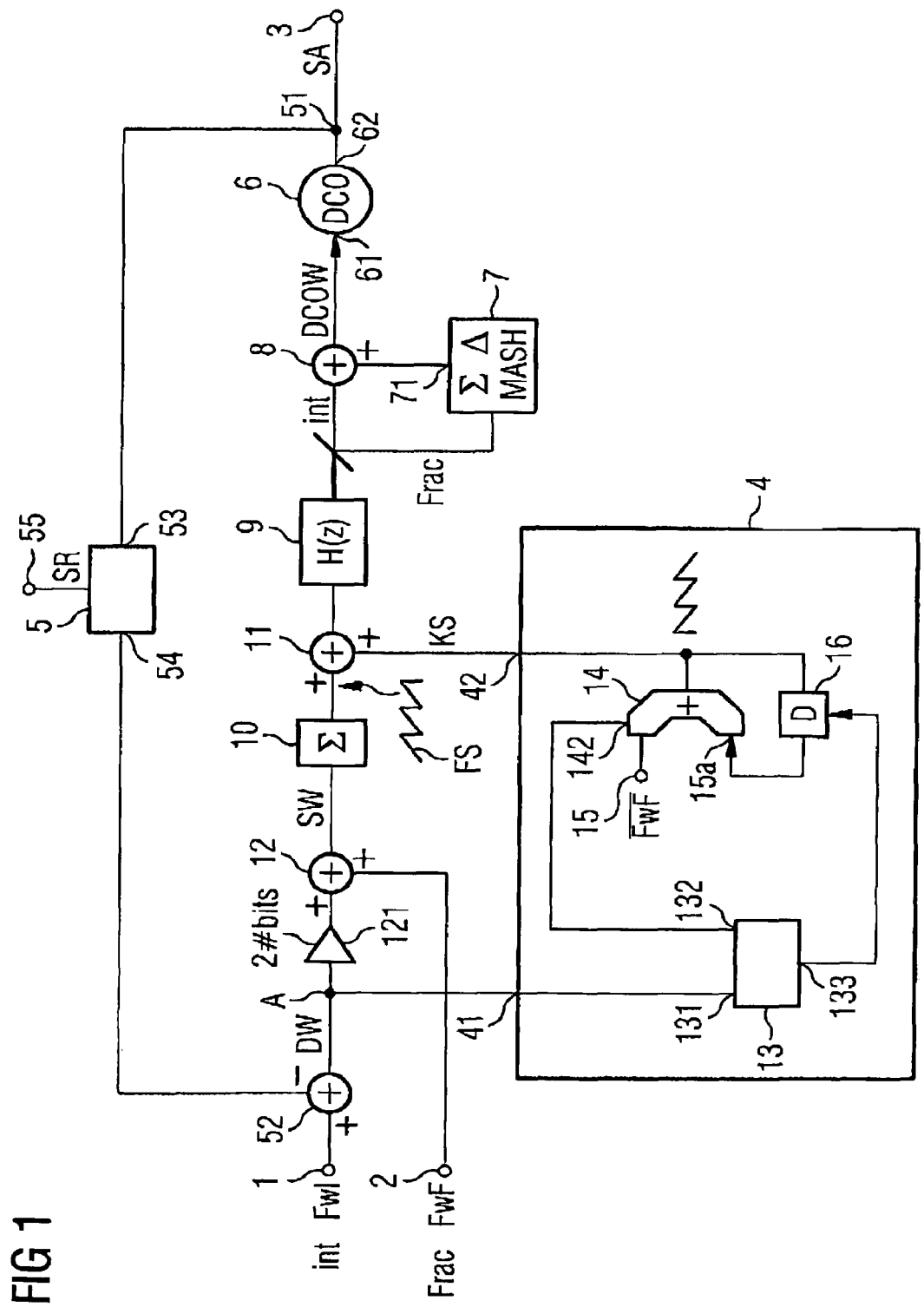
FIG. 1 shows a first exemplary embodiment of the invention.

FIG. 1 shows a configurational form of a digital phase locked loop and a correction circuit. The term digital or digitally controllable phase locked loop in the following exemplary embodiment designates a control loop whose actuating signal for setting the output frequency is generated entirely by digital signal processing. The phase locked loop contains, in particular, an oscillator for providing an output signal, which oscillator uses a digital actuating signal rather than an analog actuating signal for setting its frequency. The digital actuating signal is in turn generated by digital signal processing in the forward path of the phase locked loop.

The digital phase locked loop in accordance with FIG. 1 comprises two input terminals 1 and 2 and also an output tap 3 for outputting an output signal SA. The two input terminals 1 and 2 serve for feeding in a respective frequency word, which determine the output frequency of the phase locked loop. The first frequency word, the so-called integer component Int, is fed to the digital phase locked loop as frequency word FwI at the first input terminal 1. The second component Frac forms a fractional component, is accordingly always less than the value 1 and is fed as second frequency word FwF to the second input terminal.

With the first and the second frequency word FwI, FwF, the frequency of the output signal SA of the phase locked loop can be controlled in such a way that non-integer multiples of a reference frequency can also be set. The two frequency words are referred to a reference frequency. In the present case, the reference frequency is 104 MHz. If, accordingly, a frequency of 1059 MHz, for example, is intended to be achieved, then the first frequency word FwI has the value 10 and the second frequency word has the value 0.5.

The phase locked loop contains a forward path and also a feedback path. In the forward path, the first input terminal 1 is connected to a first differentiating element 52. A second input—of the differentiating element 52 is connected to the feedback path. The output of the differentiating element 52 is connected via a tap A to a multiplier 121. The latter multiplies the first frequency word by the factor $2^{\#Bits}$. This multiplication is necessary in order to achieve a sufficiently good resolution for the setting of the frequency word. Thus, by way of example, for a resolution of 1.5 Hz given a carrier frequency in the region of 2 GHz and a reference frequency of 104 MHz, it is necessary to multiply the integer component of the first frequency word FwI by the factor $2^{25}$.

This is achieved in the multiplier 121 by virtue of the fact that a shift register of corresponding length is provided, in which the first frequency word FwI is shifted, by 25 bits in the example. As a result, the output word DW has a length of 25 bits. The output of the multiplier 121 is connected to an adder 12, the second input of which is connected to the second input terminal 2 for feeding in the second frequency word FwF. The output word output by the adder 12 forms the frequency setting word SW. It is fed to an integrator 10 which essentially represents a summation unit, is one example. The latter adds the frequency setting word SW present at its input to a result situated in its memory and outputs the new result at the output.

The output of the integrator is connected to a loop filter 9 via a second summing element 11. The loop filter 9 may in this case have an integrating and a non-integrating transfer response. In both cases it has a low-pass filter characteristic for suppressing high-frequency components. The output of the loop filter 9, at which the filtered and integrated frequency setting word having a length of 25 bits can be tapped off is in turn split into two parts. The two least significant digits Frac of the frequency setting word output by the loop filter, the "least significant bits", are fed to a sigma-delta ($\Sigma$-$\Delta$) modulator 7. The latter generates a mean value from the temporal profile and outputs the mean value at its output 71 again. The output 71 is connected to another adder 8, to the other input of which is fed the remaining integer component INT of the word output by the loop filter. From this the adder 8 generates the setting word DCOW for the setting of the output frequency of the value-discretely tunable oscillator 6.

Figure 5:
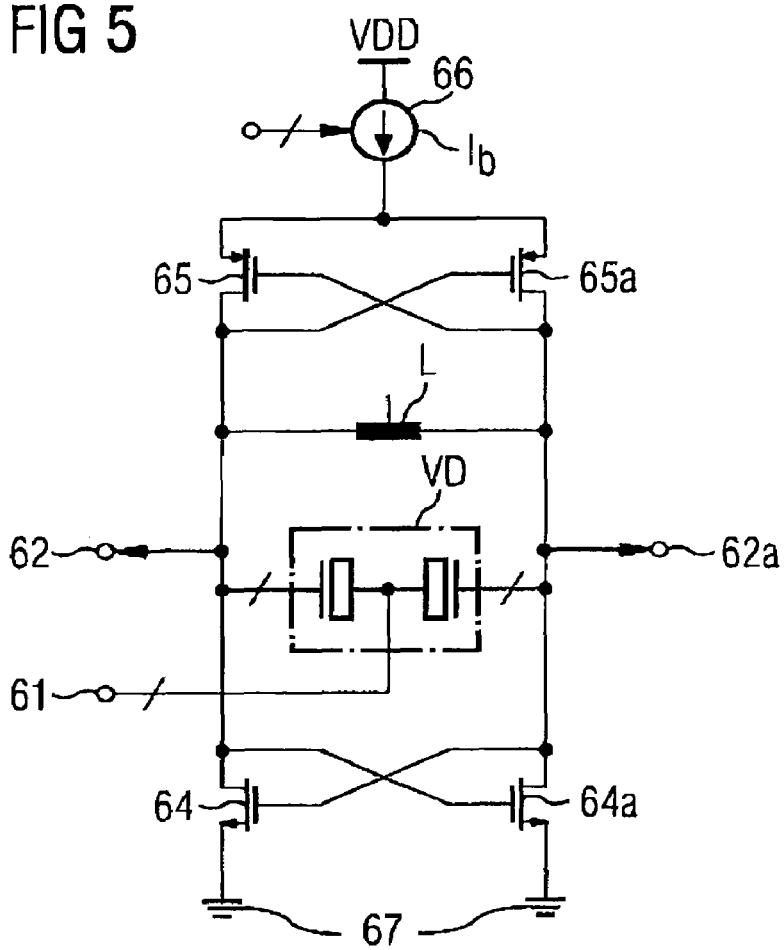
FIG. 5 shows an exemplary embodiment of a value-discretely tunable oscillator.

FIG. 5 shows one embodiment a value-discretely tunable oscillator 6. According to the invention, however, other alternations are contemplated herein. The value-discretely tunable oscillator 6 comprises an oscillator tank as a frequency determining and oscillating element, comprising a coil L and—arranged in parallel—a bank VD comprising a plurality of varactor diodes. The individual varactor diodes of the bank VD can be connected in or out by means of the corresponding setting word DCOW at the actuating input 61 in such a way that the total capacitance of the bank changes by a corresponding portion. The resonant frequency of the resonant circuit is thus changed by individual varactor diodes of the varactor bank VD being connected in or out in a value-discrete manner. Instead of the varactor diodes, it is also possible to use other capacitive elements, for example switchable capacitors.

For deattenuation of the resonant circuit, provision is additionally made of two symmetrically constructed deattenuation amplifiers comprising the field-effect transistors 64, 64A and 65, 65A. In this case, the drain terminals of the transistors 65 and 65A of the first deattenuation amplifier are connected to the supply potential VDD via a controllable current source 66. The source terminals of the transistors 64 and 64A of the second deattenuation amplifier are equally connected to the ground potential 67. In this configurational form, the value-discretely tunable oscillator 6 is embodied with a symmetrical output with the two output taps 62 and 62A. The output signal SA having the frequency set by means of the setting word DCOW can be tapped off at the output.

Referring again to FIG. 1, the output of the value-discretely tunable oscillator 6 is connected to a feedback path via a tap 51. The feedback path contains a counter 5, the input 53 of which is connected to the tap 51. The counter determines the number of clock periods in output signal SA of the value-discretely tunable oscillator 6. The reference signal SR having a reference frequency is likewise fed to the counter 5 via an input 55. After each clock period of the reference signal SR, the counter 55 outputs the value of the hitherto counted periods of the output signal SA at its output 54 and is simultaneously reset. The counter thus determines the number of clock periods of the output signal SA with respect to each clock period of the reference signal SR.

The output 54 of the counter 5 is connected to the second input of the differential element 52. The value output by the counter 5 is subtracted from the first frequency word by the differential element 52. An error word representing the difference between the first frequency word and the value output by the counter 5 is thus produced as the result at the output of the differential element 52.

The functioning of the correction circuit 4 will now be explained in more detail below. In this respect, it is assumed by way of example and in no way restrictively that the phase locked loop illustrated in FIG. 1 is intended to generate an output signal at 4.160060 GHz. The frequency $f_{SR}$ of the reference signal SR is 104 MHz. The first frequency word FwI, which represents an integer component, can be determined from this. The following holds true for the integer:

$$FwI = \text{integer}(f_{SA}/f_{SR})$$

where $f_{SA}$ is the desired output frequency of the phase locked loop and $f_{SR}$ is the frequency of the reference signal SR. For the example present, the value 40 results for the first frequency word FwI. The second frequency word FwF, which represents the fractional component, as it were the remainder with respect to the desired frequency of the output signal can be determined in the same way. The following holds true for this:

$$FwF = \text{integer}((f_{SA} - FwI \cdot f_{SR})/f_{SR} \cdot 2^{\#Bits})$$

The value "#Bits" represents the length in bits of the frequency setting word fed to the accumulator or integrator 10. For a resolution of 1.5 Hz, it is necessary to set this value "#Bits" to 25 bits. Under this condition, the value 38716 results for the second frequency word.

When the two frequency words FwI and FwF are fed into the phase locked loop illustrated, the control loop generates an output signal having the desired frequency plus a high-frequency noise. The latter arises on account of the fact that in practice the value-discretely tunable oscillator 6 can only generate a finite number of well-defined output frequencies.

The output signal SA is fed to the counter 5 which determines the clock periods with regard to the reference frequency. Since the desired output frequency of 4160.060 GHz is 60 kHz higher than 40 times the reference frequency of 104 MHz, a sequence of the values 40 and 41, respectively, results at the output of the counter 5. The ratio of these two values is 1733:1, the frequency ratio $f_{SA}/f_{SR}$.

These values are subtracted from the first frequency word fed in. Consequently, a periodic sequence of the values 0 and −1 results at the tapping point A of the phase locked loop. In this case, the value −1 follows every 1734 times. The integrator 10 connected downstream will integrate this sequence of the values 0 and −1 multiplied by the factor $2^{25}$ plus the second frequency word FwF. In this case the second frequency word FwF is significantly less than the factor $2^{25}$. Accordingly, the second frequency word FwF is present 1733 times at the input of the integrator. Every $1734^{th}$ time, however, a value which can be represented by $-2^{\#Bits} + FwF = -2^{25} + 38716$ is added to input of the integrator 10. This value is almost −1 in a ratio with the factor $2^{25}$.

An integration of the values produces at the output of the integrator 10 a superposition of the frequency setting word with a periodic error component FS in the form of a sawtooth sequence, the frequency of which is 60 kHz. However, the loop filter 9 connected downstream of the integrator 10 has a higher cut-off frequency and is thus unable to sufficiently suppress the saw-tooth-waveform signal. This leads in the output signal SA to the generation of an interference signal at 60 kHz or the integer multiple thereof. The maximum amplitude of the sawtooth-waveform signal in the frequency setting word is $2^{\#Bits}$ in the maximum case, that is to say $2^{25}$ in the present exemplary embodiment.

Figure 6A:
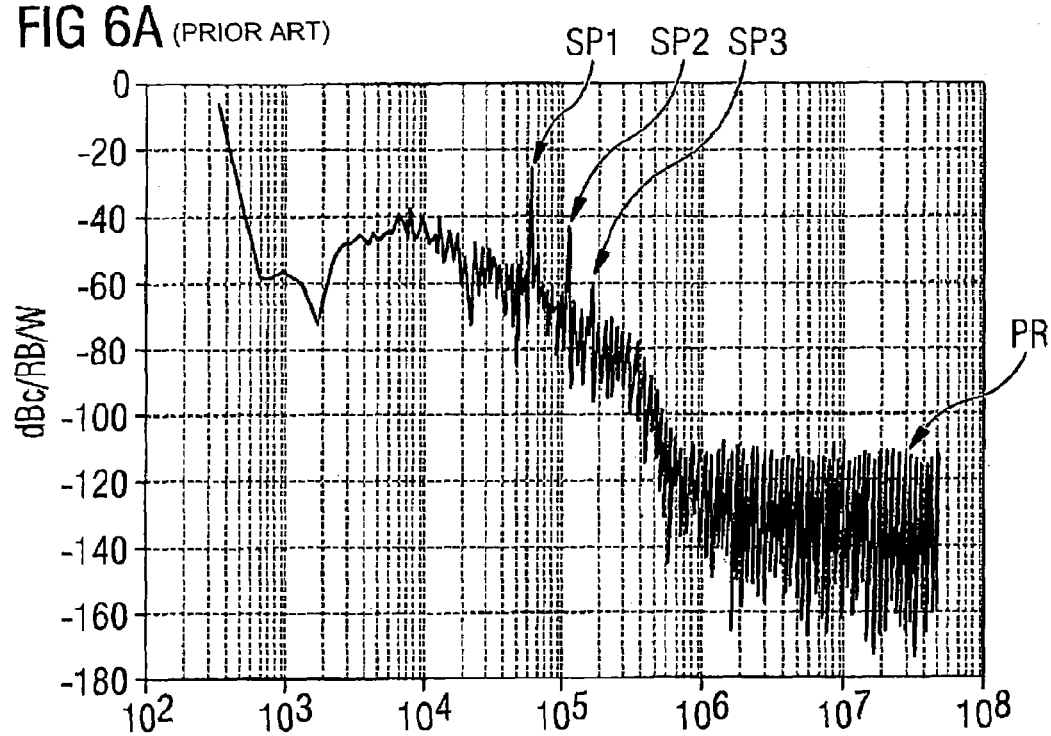
FIG. 6A shows a level-frequency diagram showing the phase noise of a signal of a prior art digitally tunable phase locked loop with interference signals.

FIG. 6A shows the phase noise of the phase locked loop if the error component FS is not addressed. The additional interference signals SP1, SP2 and SP3 at a spacing of 60 kHz, 120 kHz and 180 kHz from the carrier signal are clearly discernable.

In order to suppress this periodic error in the frequency setting word, the correction circuit 4 of the invention is provided. This exemplary embodiment provides for adding a corresponding correction word having the same period and amplitude as the error component FS to the integrated frequency setting word, the correction word being temporally mirrored with respect to the error component.

This is illustrated in FIG. 1 by the sawtooth-waveform profile of the correction word KS, said profile representing a temporally mirrored profile of the error component FS. An addition of the correction word KS to the integrated frequency word with the error component FS leads to a constant value, the frequency drift of the value-discretely tunable oscillator 6 thereby being corrected. Furthermore, the constant value can be suppressed by the loop filter 9 without relatively great difficult. This is the case particularly when the loop filter 9 has an integrating transfer response.

For generating the correction word, the correction circuit 4 comprises a summation unit 14 having a first input 15 and a second input 15A. On the output side, the summation unit 14 is connected to the output 42 of the correction circuit. The output of the summation unit 14 is likewise connected to a memory module 16, which is in turn feedback-connected to the input 15A of the summation unit 14. A correction word $\overline{FwF}$, which is formed by the difference between $2^{\#Bits} - FwF$ is fed to the summation unit 14 at its input 15. The following holds true for the correction word $\overline{FwF}$ that is fed in:

$$\overline{FwF} = 2^{\#Bits} - FwF$$

By means of the feedback of the output of the summation unit 14 to the second input 15A via the memory module 16, the summation unit 14 adds the word $\overline{FwF}$ fed in to the result of the preceding arithmetic operation. This produces, at the output 42 of the correction circuit 4 a sawtooth-waveform profile of the correction word KS which has the same period as the error component FS in the frequency setting word of the phase locked loop.

Furthermore, the summation unit 14 generates an overflow value C at its output 42. Said value indicates if the sum at the output of the summation unit 14 has exceeded the value $2^{\#Bits}$.

The overflow value C is fed to a circuit 13 at an input 132. A further input 131 of the circuit 13 is connected to the first input 41 of the correction circuit 4. On the output side, the circuit 13 is connected to the memory 16.

A correction of the error component FS in the frequency setting word by the correction word KS is successful only when the phases of the error component FS and correction word KS match. In other words, it is necessary for the correction word, in the present exemplary embodiment, to reach its maximum value whenever the error component is a minimum. The circuit 13 ensures the phase of the error component FS matches the phase of the correction word KS. For this purpose, it monitors the difference between the first frequency word FwI and the value supplied by the counter 5 and also the value of the overflow value C. In the event of registering an overflow of the summation unit 14 at the input 132 and the value −1 at the monitoring point A, the circuit 13 enables the memory register 16 and resets the summation unit 14. From this point in time, the correction word KS is generated and fed to the forward path of the control loop or to the frequency setting word via the adder 11. It thus corrects the error component FS into the frequency setting word integrated by means of the integrator 10.

Figure 2:
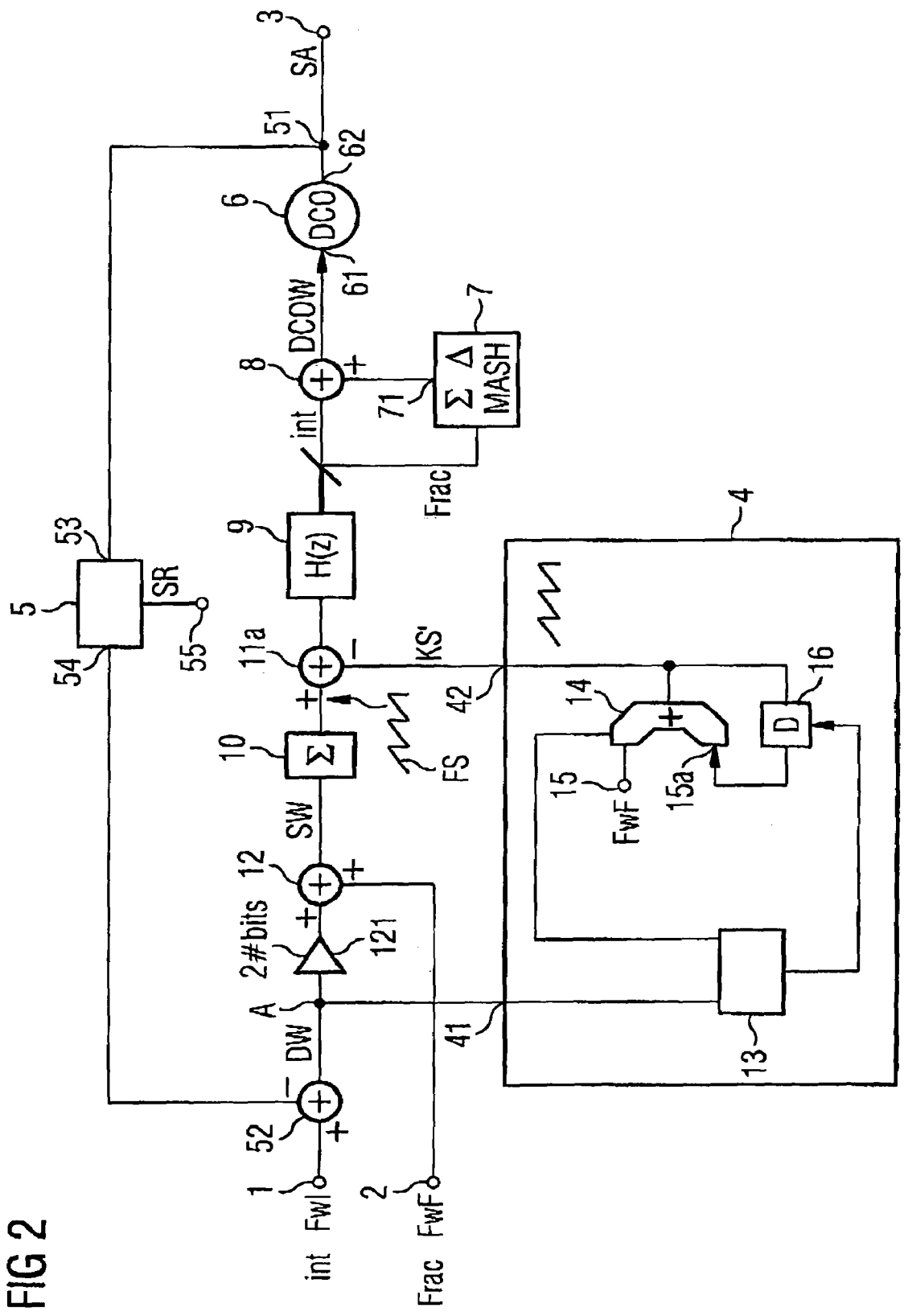
FIG. 2 shows a second exemplary embodiment of the invention.

FIG. 2 shows a modification of the phase locked loop according to another embodiment of the invention. Operatively or functionally identical components bear the same reference symbols. In this example, a differential element 11a is provided between the integrator 10 and the loop filter 9. The differential element forms the difference between the integrated frequency setting word output by the integrator 10 and having the interference component FS applied to it and the correction word KS'. The correction word KS' is once again generated by the correction circuit 4. In this case, however, the second frequency word FwF is fed to the input 15 of the summation unit. The correction word KS' thus generated corresponds in terms of its period and amplitude to the error component FS of the frequency setting word output by the integrator 10. In this case, too, the circuit 13 is again provided which determines the phases of the error component in the integrated frequency setting word and the correction word KS' and controls the generation and outputting of the correction word KS'.

Figure 6B:
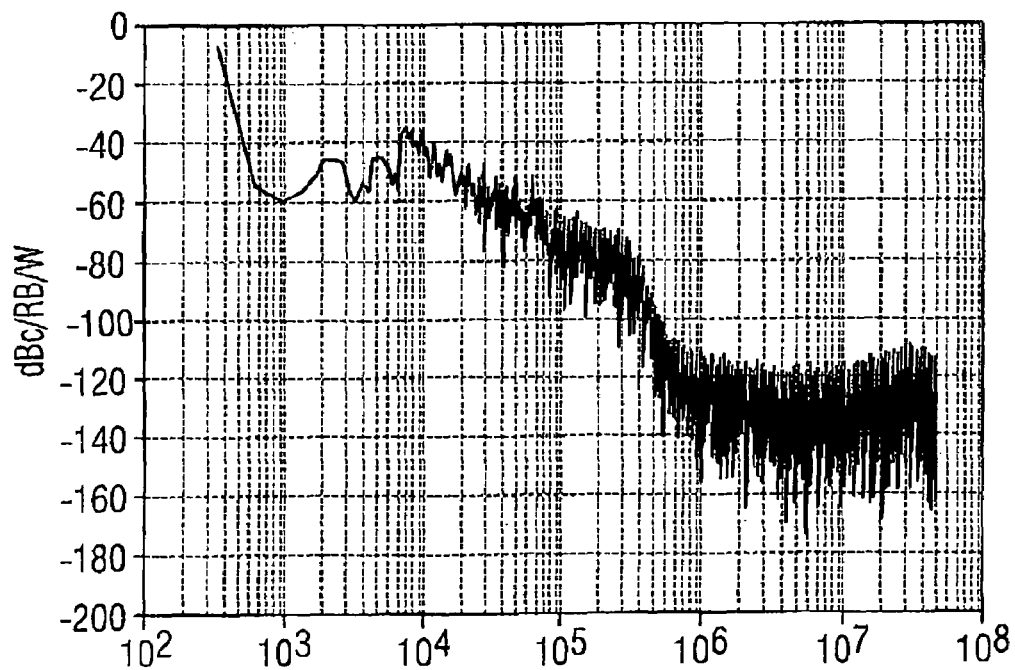
FIG. 6B shows a level-frequency diagram with the phase noise of a carrier signal of a control loop in accordance with one embodiment of the invention.

FIG. 6B shows the phase noise at the frequency spacing in the case of a digital phase locked loop having the correction circuit illustrated in FIG. 1 or 2, for example. It can clearly be discerned here that the interference signals occurring in FIG. 6A are no longer present. Moreover, the rest of the profile of the phase noise has not deteriorated significantly.

Figure 3:
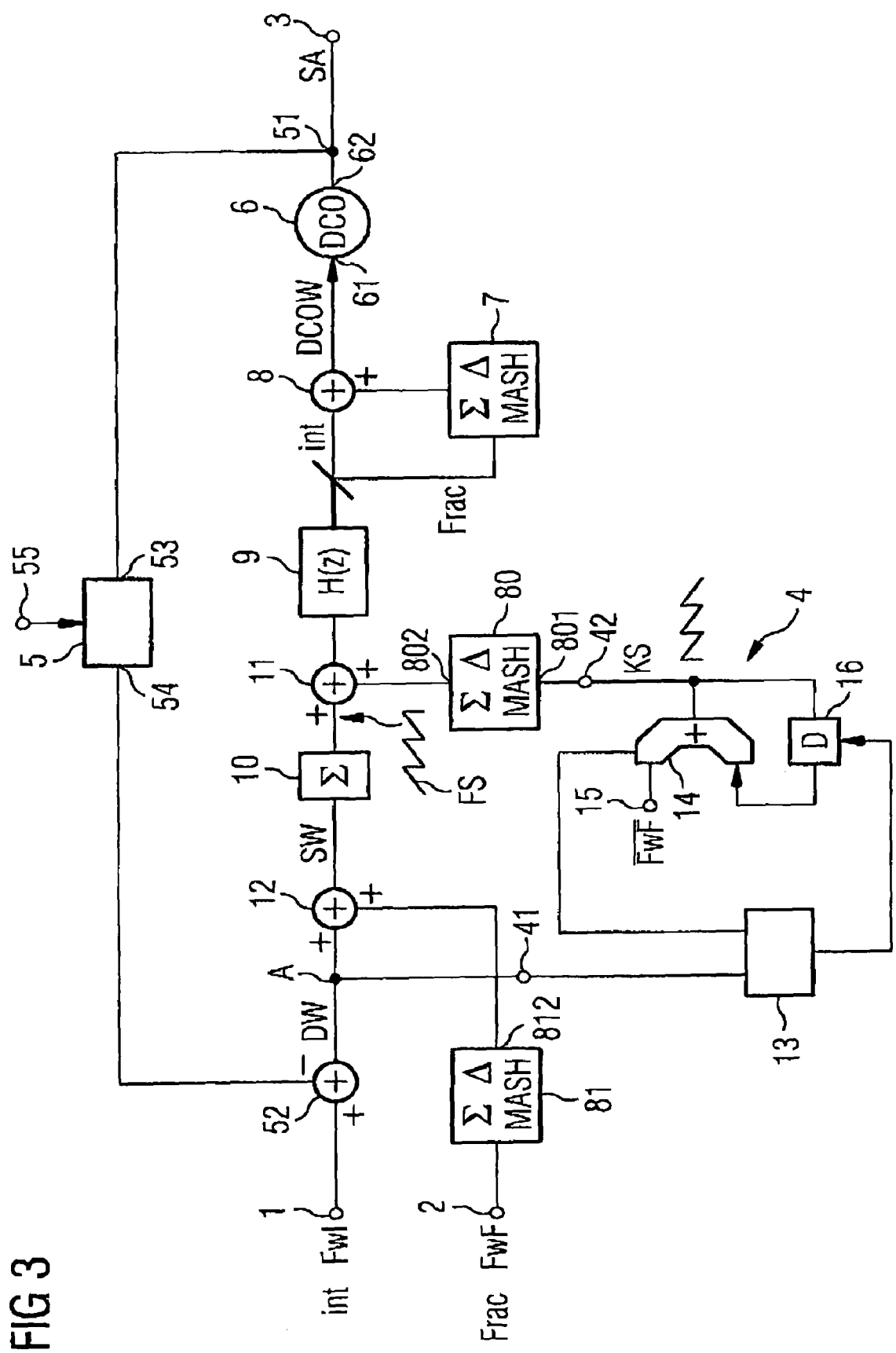
FIG. 3 shows a third embodiment of the invention.

FIG. 3 shows a further embodiment of a phase locked loop having the correction circuit 4. This embodiment provides for supplying the second frequency word FwF, which represents the fractional component for controlling the output frequency, to a sigma-delta (Σ-Δ) modulator 81. The output of the Σ-Δ modulator 81 is in turn connected to the addition element 12. This embodiment has the advantage that it is no longer necessary for the integer component FwI to be multiplied prior to an addition. As a result, it is also possible to reduce the resolution in the integrator 10 and the loop filter 9 connected downstream. Multiplication by the factor $2^{\#Bits}$ or splitting up the first frequency word FwI into "#Bits" is no longer necessary.

In addition, a Σ-Δ modulator 80 for the correction word KS is also provided between the output 42 of the correction circuit 4 and the adder 11. The Σ-Δ modulators 80 and 81 used are constructed, in one example as cascaded modulators 80 and 81. The error component in the signal generated by the modulators 80 and 81 is once again reduced as a result.

Figure 4:
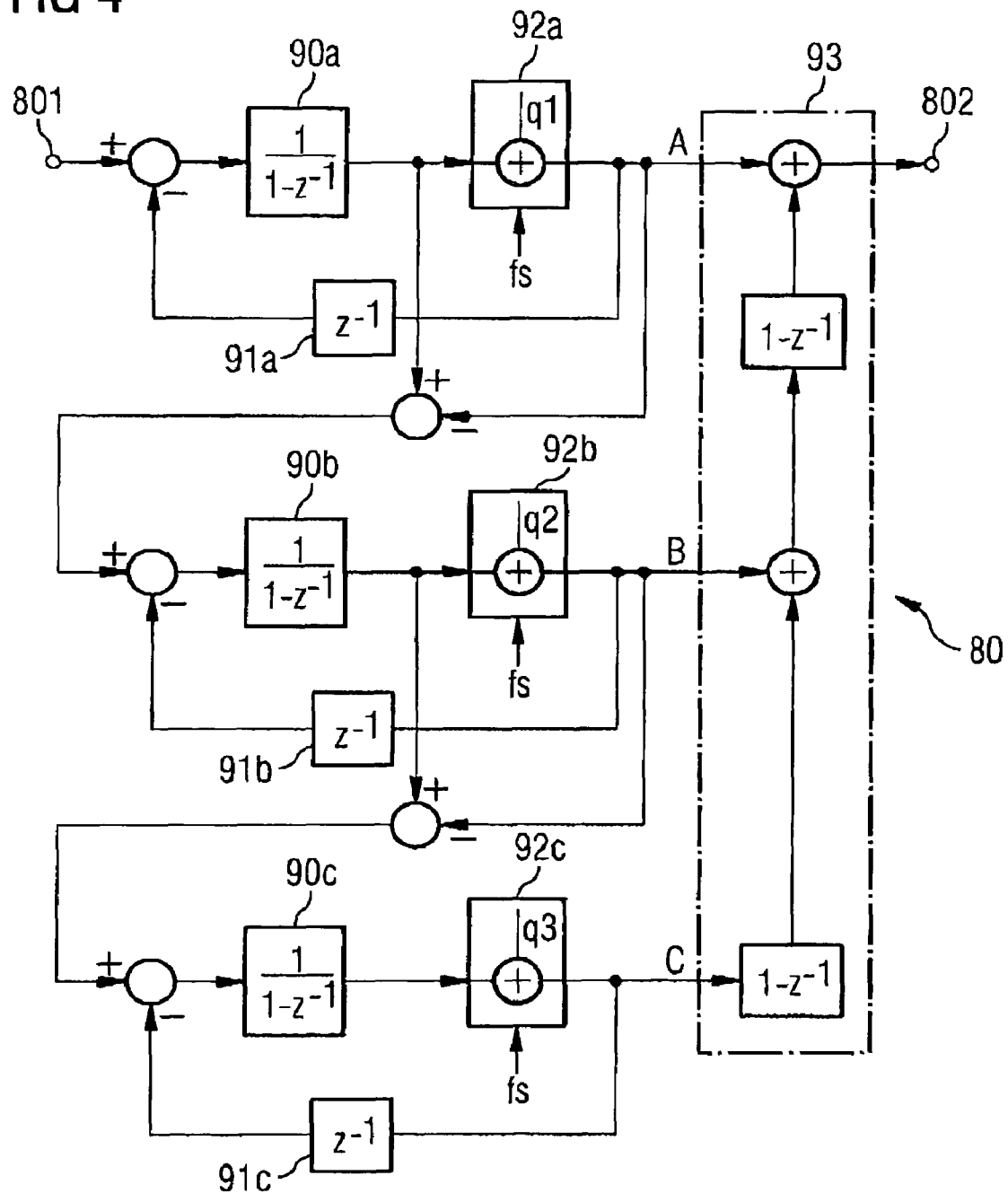
FIG. 4 shows an exemplary embodiment of a third-order cascaded $\Sigma$-$\Delta$ modulator.

FIG. 4 shows a schematic construction of the Σ-Δ modulator 80, according to one embodiment of the invention, which is embodied as a third-order cascaded modulator. It contains three elements arranged one after the other, partly in parallel. Each of the elements comprises, in a forward path, an integrator 90a, 90b, 90c and a respective quantizer 92a, 92b, 92c connected thereto. The outputs A, B, C of the quantizers are feedback-connected to the respective input of the element. In addition, the outputs of each element are connected to a respective input of a differentiator 93.

The output tap of the first element is likewise coupled to the input of the second element, and the output tap B of the second element is coupled to the input of the third element C. The coupling is effected via a subtractor which subtracts the signal from the respective output from a signal tapped off downstream of the integrators 92a, 92b.

Figure 7:
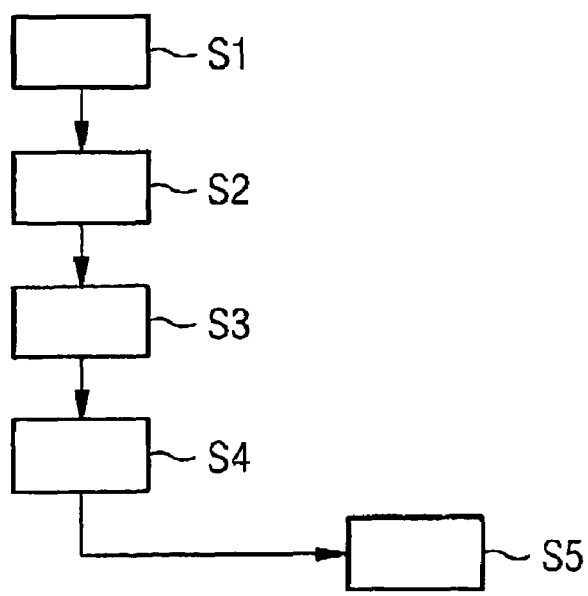
FIG. 7 shows an exemplary embodiment of the method.

FIG. 7 shows an exemplary embodiment of a method according to the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

A first act S1 provides a digital phase locked loop and determines what frequency the output signal of the phase locked loop is intended to have. For this purpose, S2 involves determining a first and a second frequency word, the first frequency word representing an integer component with respect to a reference frequency and the second frequency word representing the fractional component with respect to the reference frequency.

At S3, the first and second frequency words are fed to the phase locked loop and a frequency setting word is generated therefrom. This is effected, in one example, by an addition of the second frequency setting word with a word derived from the first frequency setting word and subsequent integration and low-pass filtering by means of a loop filter. The integrated and filtered word thus generated is used for setting a value-discretely tunable oscillator.

S3 furthermore involves determining the number of clock periods of the output signal with respect to a clock period of a reference signal. This value is subtracted from the first frequency word and the word derived from the first frequency word is thus formed.

The word derived from the first frequency word is monitored at S4. When a specific value of the derived word occurs, the generation of the correction word is performed at S4. For this purpose, the second frequency word is added to the value of a preceding operation. The correction word thereby increases with each step by the value of the second frequency word. The correction word thus generated is fed to the integrated frequency setting word having the error component applied to it at S5. The correction word generated is subtracted from the integrated frequency setting word prior to feeding to a filter.

Generally, a first and a second frequency word are accordingly provided in a method for controlling a signal. A frequency setting word is generated therefrom, for example by addition of the first and second frequency setting words. The frequency setting word is processed, for example, integrated and filtered. A setting word is formed from the processed frequency setting word and is used to generate an output signal. The output signal has a frequency dependent on the actuating word generated.

For control and frequency stabilization purposes, the output signal is fed back and the number of clock periods in the output signal is determined. The number is used in calculation with the first frequency word; by way of example, the value of the number of clock periods is subtracted from the first frequency word.

A correction word is formed from the result with the aid of the second frequency word. In this case, the correction word has a clock period which is derived from the second frequency word. The correction word is added to or subtracted from the partly processed frequency setting word. An error component which is generated in the frequency setting word on account of the processing, for example as a result of the integration, is thus reduced.

The method presented and also the correction circuit can be permanently used in a digital or digitally controllable phase locked loop. In this case, the control and the correction are independent of the output frequency which the digital phase locked loop is intended to generate. However, a correction primarily becomes effective when interference signals whose frequency is lower than the low-pass cut-off frequency of the loop filter are to be suppressed. It should be noted in this case that both the temporal period and the amplitude of the interference component in the frequency setting word are known. Only the phase is determined by the additional circuit 13 and the starting instant for the correction word is determined depending on this. The amplitude and period of the interference signal result from the second frequency setting word.

The invention claimed is:

1. A digital phase locked loop, comprising:
    a first terminal configured to receive a first frequency word and a second terminal configured to receive a second frequency word;
    a value-discretely tunable oscillator configured to generate and output a signal having a frequency;
    an integrator comprising an input coupled to the first and the second terminals, and comprising an output coupled to a loop filter that is configured to provide a digital multi-bit setting word to a set input of the value-discretely tunable oscillator;
    a feedback path comprising a counting device, the counting device configured to output a word derived from the signal of the value-discretely tunable oscillator and a reference signal, wherein an output of the counting device and the first frequency word combine at a combining element to form a third frequency word; and
    a correction circuit comprising an input coupled to an input of the integrator, and an output coupled to an output of the integrator, wherein the correction circuit is configured to generate a correction word derived from the third frequency word fed to the input of the integrator and a word derived from the second frequency word.

2. The phase locked loop of claim 1, wherein the correction circuit comprises a summation unit configured to receive the word derived from the second frequency word at a first input, and comprising a second input coupled to an output thereof and wherein the output of the summation unit forms an output of the correction circuit.

3. The phase locked loop of claim 1, wherein the correction circuit further comprises a control circuit comprising a first input that forms the input of the correction circuit, and a second input configured to receive a start value and generate the correction word based on the presence of a specific word at the first input and the start value.

4. The phase locked loop claim 3, further comprising a summation unit configured to output an overflow word which forms the start value, and wherein the summation unit is further configured to receive the word derived from the second frequency word at a first input, and comprising a second input coupled to an output thereof and wherein the output of the summation unit that provides the overflow word forms an output of the correction circuit.

5. The phase locked loop of claim 1, wherein the word derived from the second frequency word comprises the second frequency word.

6. The phase locked loop of claim 1, wherein the word derived from the second frequency word is derived from a difference between a maximum possible value of the second frequency word and the value of the second frequency word at the second terminal.

7. The phase locked loop of claim 1, wherein the output of the correction circuit is coupled via an adder to the output of the integrator.

8. The phase locked loop of claim 7, wherein an input of the correction circuit is coupled to a tap between the first terminal and the adder.

9. The phase locked loop of claim 1, further comprising an adder connected upstream of the integrator, the adder comprising a first input coupled to the first terminal, and a second input coupled to the second terminal.

10. The phase locked loop of claim 1, further comprising a Δ-Σ modulator connected downstream of the output of the correction circuit.

11. The phase locked loop of claim 1, further comprising a Δ-Σ modulator connected downstream of the second terminal of the phase locked loop.

12. The phase locked loop of claim 1, further comprising a Δ-Σ modulator coupled to an output of the loop filter, configured to generate a mean value associated with the output of the long filter to generate a Δ-Σ modulator a setting word provided to an actuating input of the value-discretely settable oscillator.

13. The phase locked loop of claim 1, wherein the counting device is configured to determine and output the number of clock periods of the signal output by the value-discretely tunable oscillator with respect to a clock period of the reference signal.

14. The phase locked loop of claim 1, further comprising a subtraction element comprising a first input connected to the first terminal and a second input connected to the output of the counting device, and configured to output a difference between words present on the first and second inputs to an output coupled to the correction circuit.

15. The phase locked loop of claim 1, wherein the loop filter comprises a low-pass filter characteristic.

16. The digital phase locked loop of claim 1:
    wherein the counting device is coupled to the first terminal to provide the third frequency word, and
    wherein the correction circuit is configured to generate the correction word derived from the third frequency word and the word derived from the second frequency word.

17. The digital phase locked loop of claim 1, wherein the counting device is configured to count a number of clock periods of the oscillator output signal with respect to a reference clock frequency of the reference signal, thereby generating the word derived from the signal of the value-discretely tunable oscillator and the reference signal.

18. A digital phase locked loop comprising:
    a forward path containing an integrator configured to provide an actuating signal, a loop filter configured to filter the actuating signal, and an oscillator that is digitally settable in terms of its output frequency;
    a feedback path containing a counter;
    an input feed for a frequency setting word into the forward path, which is coupled to an output of the counter in the feedback path for the purpose of changing the frequency setting word provided in the forward path based on the output frequency of the oscillator, wherein the frequency setting word comprises a first component and a second component and wherein, the first component of the frequency setting word is varied by a signal from the feedback path; and a correction device, coupled to the forward path and configured to correct an error component in the actuating signal output by the integrator in a manner dependent on the changed frequency setting word fed to the integrator.

19. The phase locked loop of claim 18, wherein the correction device is coupled on an input side thereof to the input of the integrator and on an output side thereof to the output of the integrator.

20. The phase locked loop of claim 18, wherein the correction device is configured to correct the error component in a manner dependent on the second component of the frequency setting word.

21. A method for correcting interference components in an output signal of a digital phase locked loop, comprising:
   providing a digital phase locked loop;
   providing a first frequency word and a second frequency word;
   generating a frequency setting word from the provided first and second frequency words;
   generating an output signal having a clock period from the frequency setting word;
   determining the number of clock periods of the output signal with respect to a clock period of a reference signal;
   generating a correction word having a clock period which is derived from the second frequency word, and a phase which is derived from a summation of the first frequency word and the determined number of clock periods of the output signal; and
   feeding in the correction word to the phase locked loop to adjust the frequency setting word.

22. The method of claim 21, wherein determining the number of clock periods comprises:
   determining the number of clock periods of the output signal between at least two successive clock periods of the reference signal; and
   deriving a value from the determined number.

23. The method of claim 22, wherein generating a frequency setting word comprises:
   forming a difference word from the first frequency word and the determined number of clock periods of the output signal;
   adding the second frequency word to the difference word; and
   integrating the sum of the second frequency word and the difference word.

24. The method of claim 21, wherein feeding in the correction word comprises:
   adding the correction word to the integrated frequency setting word prior to a filtering; or
   subtracting the correction word from the integrated frequency setting word prior to a filtering.

25. A digital phase locked loop, comprising:
   a first terminal configured to receive a first frequency word and a second terminal configured to receive a second frequency word;
   a value-discretely tunable oscillator configured to generate and output a signal having a frequency;
   an integrator comprising an input coupled to the first and the second terminals, and comprising an output coupled to a loop filter that is configured to provide a digital multi-bit setting word to a set input of the value-discretely tunable oscillator;
   a feedback path comprising a counting device, the counting device configured to output a counting word derived from the signal of the value-discretely tunable oscillator and a reference signal; and
   a correction circuit comprising an input coupled to an input of the integrator, and an output coupled to an output of the integrator, wherein the correction circuit is configured to generate a correction word derived from a third frequency word fed to the input of the integrator and a word derived from the second frequency word,
   wherein the third frequency word is a function of the first frequency word and the counting word.

\* \* \* \* \*